(12) United States Patent
Mayes et al.

(10) Patent No.: US 6,632,883 B2
(45) Date of Patent: Oct. 14, 2003

(54) BAROPLASTIC MATERIALS

(75) Inventors: Anne M. Mayes, Waltham, MA (US); Anne Valerie Ruzette, Paris (FR); Thomas P. Russell, Amherst, MA (US); Pallab Banerjee, Boston, MA (US)

(73) Assignees: Massachusetts Institute of Technology, Cambridge, MA (US); University of Massachusetts, Boston, MA (US)

( * ) Notice: Subject to any disclaimer, the term of this patent is extended or adjusted under 35 U.S.C. 154(b) by 0 days.

(21) Appl. No.: 09/788,324

(22) Filed: Feb. 16, 2001

(65) Prior Publication Data

US 2002/0042480 A1 Apr. 11, 2002

Related U.S. Application Data

(60) Provisional application No. 60/183,505, filed on Feb. 17, 2000.

(51) Int. Cl.$^7$ .......................... C08L 53/00; C08F 291/06
(52) U.S. Cl. ............................ 525/98; 525/94; 525/299; 524/523
(58) Field of Search ............................ 525/299, 94, 98; 524/523

(56) References Cited

U.S. PATENT DOCUMENTS

| | | | |
|---|---|---|---|
| 4,473,679 A | * | 9/1984 | Falk et al. ................... 525/284 |
| 5,314,962 A | | 5/1994 | Otsu et al. |
| 5,399,620 A | | 3/1995 | Niessner et al. |
| 5,468,785 A | | 11/1995 | Greuel et al. |
| 5,789,487 A | | 8/1998 | Matyjaszewski et al. |
| 5,807,937 A | | 9/1998 | Matyjaszewski et al. |
| 6,150,459 A | | 11/2000 | Mayes et al. |
| 6,207,749 B1 | | 3/2001 | Mayes et al. |

FOREIGN PATENT DOCUMENTS

| | | |
|---|---|---|
| EP | 0 992 519 A1 | 4/2000 |
| WO | WO 99/55751 | 11/1999 |
| WO | WO 01/60912 | 8/2001 |

OTHER PUBLICATIONS

M. Pollard et al., "The effect of hydrostatic pressure on the lower critical ordering transition in diblock copolymers," Macromolecules, vol. 31, No. 19, pp. 6493–6498,1998.

A.–V. G. Ruzette et al., "Phase behavior of diblock copolymers between styrene and n–alkyl methacrylates," Macromolecules, vol. 31, No. 24, pp. 8509–8516, 1998.

P.A. Rodgers, "Pressure–volume–temperature relationships for polymeric liquids: a review of equations of state and their characteristic parameters for 56 polymers," Journal of Applied Polymer Science, vol. 48, pp. 1061–1080, 1993.

D.W. Van Krevelen & P.J. Hoftyzer, Properties of Polymers Correlations with Chemical Structure, Elsevier Publishing Co., Chapt. 8, pp. 135–143, 1972.

K. Choi et al., "Determination of equation–of–state parameters by molecular simulations and calculation of the spinodal curve for polystyrene/poly(vinyl methyl ether) blends," Macromolecules, vol. 31, pp. 1366–1372, 1998.

F.S. Bates & G. H. Fredrickson, "Block copolymers–designer soft materials," Physics Today, pp. 32–38, Feb. 1999.

T. Hashimito, Thermoplastic Elastomers, $2^{nd}$ edition, G. Holden et al. editors, Hanser/Gardner Publications, Inc. 1996, Chapt. 15A, "Order–disorder transition in block polymers," pp. 430–463.

T.E. Patten & K. Matyjaszewski, "Atom transfer radical polymerication and the synthesis of polymeric materials," Advanced Materials, vol. 10, No. 12, pp. 901–915, 1998.

M. Cassebras et al., "Synthesis of di– and triblock copolymers of styrene and butyl acrylate by controlled atom transfer radical polymerization," Macromol. Rapdi Commun., vol. 20, No. 5, pp. 261–264, 1999.

R.P. Quirk and M. Morton, Thermoplastic Elastomers, $2^{nd}$ edition, G. Holden et al. editors, Hanser/Gardner Publications, Inc. 1996, Chapt. 4.2, "Methods and Problems in the Laboratory Synthesis of Triblock Copolymers," pp. 74–78.

N.A. Listigovers et al., "Narrow–polydispersity diblock and triblock copolymers of alkyl acrylates by a "living" stable free radical polymerization," Macromolecules, vol. 29, No. 27, pp. 8992–8993, 1996.

D.A. Shipp et al., "Synthesis of acrylate and methacrylate block copolymers using atom transfer radical polymerization," Macromolecules, vol. 31, No. 23, pp. 8005–8008, 1998.

* cited by examiner

*Primary Examiner*—James J. Seidleck
*Assistant Examiner*—Olga Asinovsky
(74) *Attorney, Agent, or Firm*—Wolf, Greenfield & Sacks, P.C.

(57) ABSTRACT

The present invention relates to block copolymer compositions capable of being processed by the application of pressure. The invention also provides methods for predicting phase diagrams of polymer blends and block copolymers, particularly block copolymers comprising hard and soft blocks having properties described herein. The methods of the invention allow prediction of polymeric systems which can be processed under conditions that do not promote polymer degradation.

33 Claims, 11 Drawing Sheets

BAROPLASTIC MATERIALS

RELATED APPLICATION

This non-provisional application claims the benefit under Title 35 U.S.C. §119(e) of co-pending U.S. provisional application Serial No. 60/183,505, filed Feb. 17, 2000, entitled, "Baroplastic Materials" by Anne Mayes et al., incorporated herein by reference.

FIELD OF INVENTION

The present invention relates to block copolymer compositions capable of being processed by the application of pressure. The invention also provides methods for predicting phase diagrams of polymer blends and block copolymers.

BACKGROUND OF THE INVENTION

A large number of manufactured articles are prepared from plastics. Generally, plastics are polymers that have relatively high viscosities. It has generally been accepted that to process polymers into a desired shape, a high temperature is required to reduce the viscosity and achieve a moldable state. A large drawback of today's commercial plastics, however, is degradation that occurs when subjecting the polymers to high temperature. The degradation is heightened when such plastics are recycled, i.e. the plastic articles are again subjected to high temperatures during re-molding or re-forming. Thus, unlike metals such as steel and aluminum, the recycling of a polymer does not result in a material of equivalent grade, and the number of times these materials can be reused is limited to twice at the most. There are two principal reasons for this limitation. Firstly, the accidental mixing of chemically dissimilar plastics during recycling results in a dramatic loss in mechanical and optical quality. Secondly, each forming process the material encounters greatly alters its chemical structure, leading to dramatically reduced performance. The reasons for this are the high temperatures (>200° C.) necessary for processing these materials.

Thus, there remains a need for materials that can be processed under conditions that do not promote degradation.

SUMMARY OF THE INVENTION

The present invention relates to the development of a new class of materials termed "baroplastic" materials, based on polymer compositions that can be blends or block copolymers. The compositions disclosed herein can be processed primarily by applying pressure rather than temperature, thereby allowing them to be recycled multiply and with properties equivalent to the virgin material. A method is also disclosed for calculating phase diagrams for polymer blends and solutions that can be used as an aid in the design of new polymer materials or processes of manufacture for polymers.

One aspect of the present invention provides a method comprising the step of providing a polymeric composition comprising a soft component A having a $T_{g,s}$ of less than room temperature and a hard component B in contact with the soft component A, the hard component having a $T_{g,h}$ such that hard component has negligible flow at room temperature. The method further comprises the step of applying a pressure of at least about 100 psi such that the polymeric composition exhibits Newtonian flow at a temperature of less than 150° C.

Another aspect of the present invention provides a polymeric composition comprising a soft component A having a $T_{g,s}$ of less than room temperature, and a hard component B in contact with the soft component A, the hard component having a $T_{g,h}$ such that hard component has negligible flow at room temperature. Components A and B are selected to have a relation $\phi_A \phi_B[(\rho_A - \rho_B)(\delta_A^2 - \delta_B^2)]$ of the composition having a positive value at a temperature above 100° C., wherein $\phi_A$ and $\phi_B$ represent volume fractions of the components A and B respectively, $\rho_A$ and $\rho_B$ represent reduced densities of the components A and B respectively, and $\delta_A$ and $\delta_B$ represent solubility parameters of the components A and B respectively. The densities $\rho_A$ and $\rho_B$ are matched as defined by the following relationship:

$$1.06\rho_A < \rho_B < 0.94\rho_A.$$

Another aspect of the present invention provides a block copolymer comprising a soft block having a $T_{g,s}$ of less than room temperature, and a hard block bonded to the soft block, the hard block having a $T_{g,h}$ such that the hard block has negligible flow at room temperature. A pressure coefficient that favors miscibility, $dT_{DOT}/dP$, of the block copolymer has an absolute value greater than about 30° C./kbar.

Another aspect of the present invention provides a method for selecting a polymeric composition. The method comprises the steps of selecting a component A, having a polymerization index of $N_A$, and selecting a component B, in contact with the component A, the component B having a polymerization index of $N_B$. The method further comprises the steps of determining a value of a relation $\phi_A \phi_B[(\rho_A - \rho_B)(\delta_A^2 - \delta_B^2)]$ of the composition such that the relation has a positive value at a temperature above 100° C., wherein $\phi_A$ and $\phi_B$ represent volume fractions of the components A and B respectively, $\rho_A$ and $\rho_B$ represent reduced densities of the components A and B respectively, and $\delta_A$ and $\delta_B$ represent solubility parameters of the components A and B respectively. The densities $\rho_A$ and $\rho_B$ are matched as defined by the following relationship:

$$1.06\rho_A < \rho_B < 0.94\,\rho_A.$$

Another aspect of the present invention provides a method comprising the step of determining the phase diagram of a polymer composition by determining the free energy of the composition from the following equation:

$$\Delta g_{mix} = RT\left[\frac{\phi_A \tilde{\rho}_A}{N_A v_A}\ln\phi_A + \frac{\phi_B \tilde{\rho}_B}{N_B v_B}\ln\phi_B\right] + \frac{\phi_A \phi_B \tilde{\rho}_A \tilde{\rho}_B}{v}(RT\chi^{FH}) + \phi_A \phi_B[(\tilde{\rho}_A - \tilde{\rho}_B)(\delta_A^2 - \delta_B^2)].$$

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION

Figure 1:
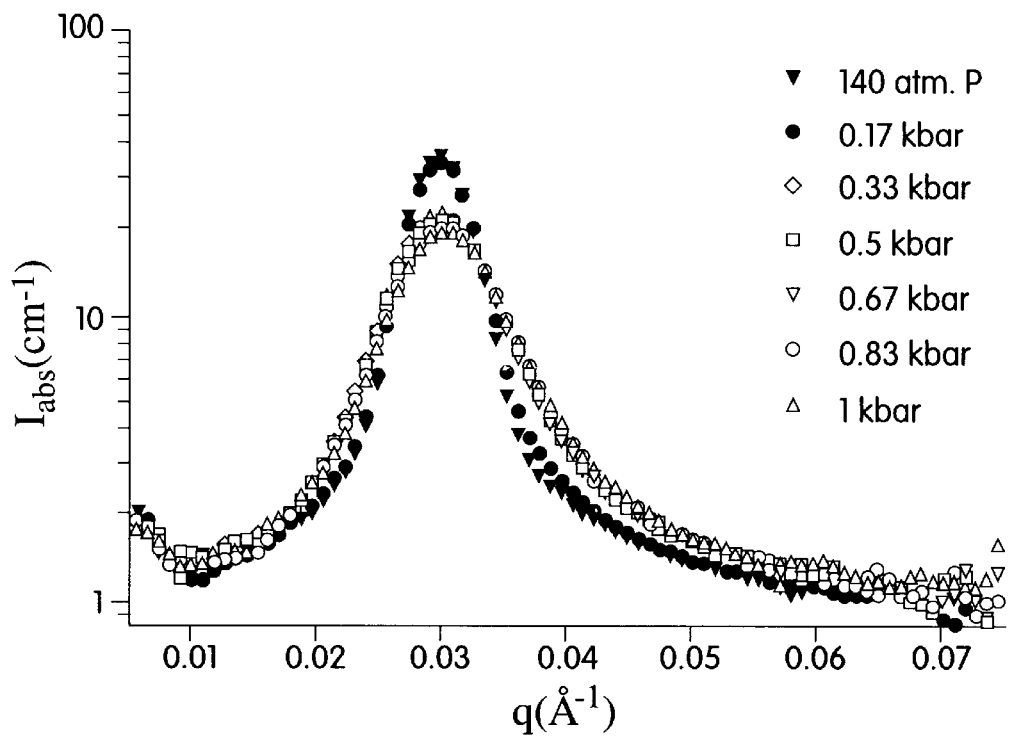
FIG. 1 shows a SANS intensity profile for PS-b-PHMA at 140° C. and indicated pressures.

The present invention provides a series of polymer compositions, methods of making and using polymer compositions, and techniques for predicting thermodynamic properties of polymer compositions and selecting components for making polymer compositions.

One aspect of the present invention provides a polymeric composition. In one embodiment, the polymeric composition is a polymer blend, i.e. a physical mixture of two or more polymers. In another embodiment, the polymeric composition is a block copolymer. In one embodiment, each monomer of a block is the same monomer. The block copolymer comprises at least two blocks. For example, a block copolymer having a block of A monomers and a block of B monomers can have the formula:

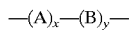

wherein x and y can be the same or different and each represents an integer great enough to cause microphase separation at service or use temperatures, i.e., a temperature the article is to be used at (typically, room temperature). x and y can easily be selected by those of ordinary skill in the art given the criteria outlined herein. The blocks can be arranged in essentially any order or sequence, for example block $(A)_x$ can be bonded at one chain end to a block of $(B)_y$. A short form of this formula is also denoted here as A-b-B where "b" indicates the bond between blocks. The block copolymer can also be a tri-block or tetra-block, etc.

In one embodiment, one block comprises a random copolymer. For example, block B can be a random array of monomers C and D such that the block copolymer has a formula:

Of course, it is understood that the block comprising a random copolymer can include more than two types of monomers (C, D, E etc.).

It is also understood that any of the blocks may be optionally interrupted by a small amount of non-block groups, e.g. the block copolymer has a formula:

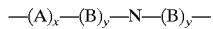

Non-block groups (e.g., "N" above) can be present in quantities small enough such that the properties of the block copolymer are not significantly perturbed. It is desired that the amount of these non-blocks be minimized.

The block copolymers can have any block molecular architecture. Examples include A-b-B diblock copolymers, A-b-B-b-C triblock copolymers, $(A-b-B)_n$ star block copolymers, A-g-B graft-type copolymers, and other copolymer architectures, provided the characteristics of the block copolymer of interest match the thermodynamic, $T_g$ (glass transition temperature) and $T_m$ (melt temperature) criteria outlined herein.

At a temperature above $T_g$ or $T_m$, due to a net repulsion between the block components, block copolymers self-assemble at the molecular level where "like" blocks aggregate to form domains, i.e. a domain (typically of nanometer dimensions) of one type of block is positioned adjacent a domain of a second type of block. Such domain formation results in a "phase separated" state, which can provide block copolymers with mechanical properties ranging from hard, tough plastics to flexible rubbers at service temperatures (e.g., such as room temperature), depending on composition choices. Unfortunately, phase separation also results in extremely high viscosities, necessitating either the use of solvents, low molecular weight blocks, and/or even higher processing temperatures to access the disordered (or phase-mixed) state of the copolymer. Access to the disordered state is necessary for processing the polymer (such as thermoforming, injection molding, coating, or other processes in which the polymer must be changed from one shape to a very different shape).

In another embodiment, the polymeric composition of the invention is a blend. The blend can be a blend of homopolymers, a blend of copolymers (including random copolymers, alternating copolymers or block copolymers), or a combination.

In one embodiment, one block comprises a soft block having a $T_{g,s}$ of less than room temperature. A soft block can be selected or screened from known or measured $T_{g,s}$ values. In one embodiment, one block comprises a hard block bonded to the soft block, the hard block having a $T_{g,h}$ or $T_m$ such that the block has negligible flow at room temperature (around 23° C.). Thus, at room temperature, the hard block is either in a glassy state or a crystalline state. A hard block can be selected or screened in a similar method as for the soft block.

In one preferred embodiment, at use temperature (typically room temperature), the polymer composition exhibits a phase separated state. For the case of a A-b-B block copolymer, the phase separated state is also referred to as the "ordered" state having local domains of A and B of sizes (e.g. mean diameter or mean thickness) from about 1 to 500 nm, preferably from about 1 to 100 nm.

One aspect of the invention involves the recognition that the polymeric compositions are processable (i.e., moldable from a first shape to a drastically different shape, such as thermoforming, compression molding, injection molding and the like) by the application of pressure at mild temperatures, and the invention provides criteria for selection of components of the composition that allow such processability. These polymers are termed "baroplastic materials" due to their ability to attain the miscible state by applying a particular pressure. By "miscible state", it is meant that the domains are absent or of negligible size. For block copolymers, the miscible state is also known as the "disordered" state. A transition from an ordered state to a disordered state is known as an "order-disorder transition,"

and a transition from a disordered state to an ordered state is known as a "disorder-order transition." Typically, a polymer composition exhibits Newtonian flow required for processing (or forming, molding, etc.) conditions when the polymer is in a miscible state and above the $T_g$ and $T_m$. Thus, in this miscible state, the polymer composition can be processed due to its flowable nature. In one embodiment, upon the application of pressure (preferably of at least about 100 psi) the polymer composition can be processed at a temperature $T_{pro}$ less than about 150° C., preferably less than about 100° C. and more preferably less than about 60° C. These temperatures define temperatures measurable at the surface of the polymer composition during processing. In one embodiment, an upper bound on the glass transition temperature of the composition ($T_{g,mix}$) can be defined by equation (1):

$$T_{g,mix} = T_{pro} - 100° \text{ C.} \tag{1}$$

In one embodiment, the hard block is crystalline and $T_{pro}$ is greater than $T_m$, the melting point of the hard block.

One parameter to determine the polymer's ability to attain the phase-mixed or miscible state from the phase-separated state by the application of pressure is a pressure coefficient, $dT_{DOT}/dP$. This coefficient defines a change in temperature, $T_{DOT}$, of the disorder-order transition per change in pressure, P. For polymer compositions exhibiting a disorder-order transition with decreasing temperature, the application of pressure lowers the temperature of the disorder-order transition. Because the disorder-order transition occurs at lower temperatures upon the application of pressure (compared to the absence of pressure), the miscible state is attained at lower temperatures and accordingly the polymer can be processed at lower temperatures where degradation is reduced or negligible. For polymer compositions exhibiting a disorder-order transition with increasing temperature, the application of pressure raises the temperature of the disorder-order transition. Preferred polymer compositions exhibit large pressure coefficients in which an absolute value of $dT_{DOT}/dP$ is at least about 30° C./kbar, preferably at least about 50° C./kbar and more preferably at least 100° C./kbar. In one embodiment, the applied pressure is at least about 100 psi, preferably at least about 200 psi, and more preferably at least about 500 psi, more preferably at least about 1000 psi.

An aspect of the present invention also provides the discovery that by relieving the applied pressure, phase separation or ordering occurs, thereby making the composition dimensionally stable. This is desirable to maintain a particular shape of the article after processing.

In one embodiment, the weight fractions of the soft and hard blocks, $w_s$ and $w_h$ respectively, can be selected to achieve a polymer that exhibits a miscible state at the above-mentioned temperature by the following relationship:

$$1/T_{g,mix} = w_s/T_{g,s} + w_h/T_{g,h} \tag{2}$$

where $T_g$ values are expressed in Kelvin. For example, one block copolymer of the present invention, polystyrene-b-poly(hexyl methacrylate) (i.e. having the formula —(polystyrene)$_x$—(hexyl methacrylate)$_y$—), has a $T_{g,STY}$= 100° C. (373 K) and $T_{g,HMA}$=0° C. (273 K), so that $T_{g,mix}$ for a copolymer with 20 wt % polystyrene (PS) is 16° C. (STY=polystyrene block; HMA=hyxyl methacrylate block). Thus, $T_{pro}$ for this material can be as low as 116° C. For the same copolymer components with 50 wt % PS, $T_{g,mix}$ is 42° C., so that $T_{pro}$ could be as low as 142° C. In another example, poly(butyl methacrylate)-b-poly(butyl acrylate) (PBMA-b-PBA), $T_{g,PBMA}$=25° C. (298 K) and $T_{g,PBA}$=−53° C. (220 K), $T_{g,mix}$ for a copolymer with 50 wt % butyl methacrylate is −20° C., so that $T_{pro}$ for this material could be as low as 80° C. For the same copolymer components with 20 wt % PBMA, $T_{g,mix}$ is −42° C., so that $T_{pro}$ could be as low as 58° C.

It is a feature of one aspect of the present invention that polymer compositions can be selected that are phase separated at service or room temperature and pressure, yet have large pressure coefficients that allow the copolymer to be miscible upon the application of pressure at $T_{pro}$. One aspect of the invention is a screening method that provides a prediction of phase properties of the polymer compositions under processing conditions and under service temperatures by using parameters that are either known, calculable, or simulable. Such parameters include polymer densities, solubility parameters, thermal expansion coefficients and polymerization indices. Previously, phase properties were determined by actually making the polymers, subjecting them to different processing conditions and measuring their phase properties. The present invention allows one to omit such excessive experimentation steps in choosing desirable copolymers for processing. The screening method of this aspect of the invention provides the capability to process polymer compositions by causing Newtonian flow in the compositions under application of pressure at mild temperatures, and thus reducing or eliminating degradation.

Such polymer compositions can be screened by applying a free energy model. The well-known Flory-Huggins model for polymer blends calculates entropic and enthalpic contributions to a change in free energy upon mixing assuming an incompressible mixture. In contrast, the present invention also accounts for a change in volume of the pure components and the mixture as a function of temperature and pressure. The free energy expression for polymer blends will be presented here for the sake of simplicity. The identical criteria can be used for choosing block copolymer components, however.

According to this aspect of the present invention, a model for a change in free energy upon mixing is represented as equation (3):

$$\Delta g_{mix} = RT \left[ \frac{\phi_A \tilde{\rho}_A}{N_A v_A} \ln \phi_A + \frac{\phi_B \tilde{\rho}_B}{N_B v_B} \ln \phi_B \right] + \frac{\phi_A \phi_B \tilde{\rho}_A \tilde{\rho}_B}{v} (RT\chi^{FH}) + \phi_A \phi_B [(\tilde{\rho}_A - \tilde{\rho}_B)(\delta_A^2 - \delta_B^2)] \tag{3}$$

The first term in equation (3) represents the translational entropy of mixing components A and B. The second term represents the enthalpic contribution upon mixing which is usually unfavorable. From an energetic standpoint, components generally prefer to aggregate with like components.

The third term represents the change in free volume and arises from the difference in the initial and final densities of the components in transforming from the phase separated to the miscible state. This change in density has the effect of concentrating or diluting self interactions. From this term, one can determine which polymer pairs will have large pressure coefficients, since its magnitude has a significant dependence on pressure.

Various methods can be used to obtain the thermodynamic parameters of equation (3), as described below.

In eq.(3), $\phi_i$ is the volume fraction of component i, $N_i$ is the polymerization index of polymer i, $v$ is the average molar monomer volume, $v = (v_A v_B)^{1/2}$, and $\rho$ is the reduced density. The volume fraction $\phi_i$ can be measured or calculated by methods known to one of ordinary skill in the art. The polymerization index $N_i$ is easily calculated from known molecular weight measurement techniques. R is the gas constant and T is the temperature at mixing.

The reduced density can be determined from equation (4):

$$\rho_r = \rho_i / \rho_i^* \tag{4}$$

where $\rho_i$ is the mass density and $\rho_i^*$ is the hard core density (mass density at 0 Kelvin). The mass density $\rho_i$ at different temperatures (i.e. $\rho_i(T)$) are available for various polymers over certain temperature ranges (e.g. see P. A. Rodgers, J. Appl. Polym. Sci. Vol. 48, p. 1061, 1993) or they can be simulated. The hard core density, $\rho_1^*$, can be determined from PVT data by extrapolation of experimental density data to zero K for pressure P=0 (e.g. by using the Tait equation), assuming constant thermal expansion coefficients, $\alpha$ (melt state values). $v_i$ can be calculated from equation (5):

$$v_i = M_{u,i} / \rho_i^* \tag{5}$$

where $M_{u,i}$ is the monomer molecular weight.

The second term in eq. (3) arises from enthalpic contributions. $\chi^{FH}$, the Flory-Huggins interaction parameter, is related to an excess exchange interaction energy $\Delta\epsilon$ according to equation (6):

$$\chi^{FH} = z\left[\epsilon_{AB} - \frac{\epsilon_{AA} + \epsilon_{BB}}{2}\right] / RT = z\Delta\epsilon / RT \tag{6}$$

where z is a number of nearest neighboring monomers and $\epsilon_{ij}$ is the hard core (i.e. at zero K) attractive interaction energy (<0) between monomers i and j. Berthelot's mixing rule and the Hildebrand solubility parameter formalism can be assumed for the evaluation of $\chi^{FH}$ wich equates the A-B cross interaction energy $\epsilon_{AB}$ to the geometric average of the pure component interaction energies $\epsilon_{AA}$ and $\epsilon_{BB}$ as defined in equation (7):

$$\epsilon_{AB} = \sqrt{\epsilon_{AA}\epsilon_{BB}} \tag{7}$$

The pure component interaction energies $\epsilon_{ii}$ are in turn related to the experimental Hildebrand solubility parameters $\delta_i$, which is the square root of the cohesive energy density and has units of $(J^{1/2} \text{ cm}^{-3/2})$ as shown in equation (8):

$$\delta_i^2(T) = -\frac{1}{2}\frac{z\epsilon_{ii}}{v_i}\tilde{\rho}_i(T) \tag{8}$$

At the hard core state (0 K), $\rho_r = 1$, and the hard core solubility parameter is represented as the relation in equation (9):

$$\delta_i^2(0) = -\frac{1}{2}\frac{z\epsilon_{ii}}{v_i} \tag{9}$$

According to Berthelot's mixing rule and the Hildebrand solubility parameter formalism, $\chi$ is thus related to the individual component solubility parameters as shown in equation (10):

$$\chi = \frac{v}{RT}(\delta_A(0) - \delta_B(0))^2 \tag{10}$$

The main assumptions underlying equation (3) are: (1) no volume changes upon mixing, (2) ideal entropy of mixing, (3) weak forces of the induced dipole type (dispersive interactions), and (4) Berthelot's rule for the cross interaction energy. Such a formalism implies $\chi$ is always positive.

Group contribution methods, which evaluate homopolymer properties based on the contribution of each chemical group present in the repeat unit, are typically used to determine the solubility parameter, $\delta$. A basic assumption of such calculations is that the contribution of a given chemical group, such as a methyl ($CH_3$) group, is independent of its chemical and structural environment. Several databases of group contributions at 25° C. (298 K) have been developed, using PVT (i.e. pressure-volume-temperature data) data for homopolymers or small molecule analogues. Different formalisms for the evaluation of $\delta$ can be used and can include contributions not only from dispersive van der Waals interactions, but also dipole/dipole and hydrogen bonding interactions. For example, a three component cohesive energy density can be used (D. W. Van Krevelen and P. J. Hoftyzer, Properties of Polymers. Correlation with Chemical Structure, Elsevier, N.Y., 1972) as shown in equation (11):

$$\delta^2 = \delta_d^2 + \delta_p^2 + \delta_H^2 \tag{11}$$

Alternative methods to obtain the pure component thermodynamic parameters necessary for equation (3) can involve molecular dynamics and energy minimization simulations. For example, the density, cohesive energy density and hard core (OK) parameters of several polymers can be determined from the commercially available software, Cerius, in combination with the force field UNIVERSAL (e.g. see Choi et al. Macromol. Vol. 31, p. 1366, 1998). These simulated densities and cohesive energy densities, obtained from hypothetical polymer chains of as little as 20 segments, were found to be in good agreement with experimentally determined values as well as those obtained from Group Contribution calculations. The advantage of such a procedure clearly relies in its predictive nature, thereby allowing one to estimate the thermodynamic properties of new polymers, including random copolymers of various compositions, instead of measuring them using a PVT apparatus. Moreover, this approach might provide an alternative approach to determine the hard core state parameters in comparison with the extrapolated values used here. The potential use of these simulations in combination with the free energy model given above might offer an attractive approach for the design of phase behavior into new systems.

Another approach to obtain the thermodynamic parameters necessary for equation (3) can involve built-in group contribution-like databases of commercial software packages such as Biosym. Certain modules of this software can be used to predict polymer densities as a function of temperature, solubility parameters, and thermal expansion coefficients above and below the glass transition temperature. Such methods can provide rough guidelines that are adequate from an engineering standpoint for the choice of random copolymer compositions and chemistries for the design of new functional polymer blends and block copolymers.

The applicability of equation (3) is expected to hold not only for polymer systems, but also some small molecule systems, including small molecule organics with weak secondary bonding interactions, or mixtures of polymers and solvents. The equation can be modified to calculate phase diagrams for block copolymers using approaches known to one of ordinary skill in the art (F. S. Bates and G. H. Fredrickson, Physics Today, February 1999, p.32).

In a preferred embodiment, eq. (3) can be applied as a screening method for choosing polymer compositions with large pressure coefficients that enhance miscibility. In such cases, the third term in eq. (3) is positive at temperatures greater than about 100° C., more preferably greater than about 50° C. and even more preferably greater than about 0° C. A positive third term helps ensure that applying pressure on the polymeric composition will decrease the free energy of the miscible (or mixed) state. In addition, the polymeric composition is sufficiently immiscible to exhibit an order-disorder (i.e. phase separated-riscible) transition in a desired processing temperature range, generally a range of commercial interest, i.e. not below service temperature and not above $T_{pro}$. A positive third term for temperatures above 100° C. is a necessary but not sufficient condition to ensure a large pressure coefficient. A second necessary condition is selecting polymer components (blocks for a block copolymer, polymers for a blend) having closely matched densities. One example for screening for matched densities is represented by a density range at 25° C. (298 K) expressed in equation (12):

$$1.06\rho_A < \rho_B < 0.94\rho_A \tag{12}$$

This condition limits the magnitude of the second and third terms of equation (3), allowing at least marginal miscibility of the polymer components.

For crystalline polymers, density values can be extrapolated from above the melt temperature, $T_m$, to yield an effective melt-state density at 25° C.

In a preferred embodiment, the glass transition of the polymer composition as defined by eq. (2) obeys (1), where $T_{pro}$ is less than 150° C., preferably less than 100° C., and more preferably less than 50° C.

Examples of polymeric compositions of the present invention which are screened by the above-mentioned methods include the block copolymers: polystyrene-b-poly(hexyl methacrylate) copolymers wherein $0<w_s \leq 45\%$, poly(ethyl methacrylate)-b-poly(ethyl acrylate) copolymers wherein $0<w_{EMA} \leq 85\%$, polycaprolactone-b-poly(ethyl acrylate) wherein $0<w_{PCL}<100\%$, polycaprolactone-block-poly(ethyl methacrylate) wherein $0<w_{EMA} \leq 92\%$, poly(caprolactone)-block-poly(methyl methacrylate) wherein $0<w_{MMA} \leq 75\%$, poly(methyl methacrylate)-b-poly(ethyl acrylate) copolymers wherein $0<w_{MMA} \leq 65\%$, poly(ethyl methacrylate)-b-poly(methyl acrylate) copolymers wherein $0<w_{EMA} \leq 85\%$, polystyrene-block-poly(vinyl ethyl ether) wherein $0<w_{STY} \leq 80\%$, polystyrene-block-poly(butyl acrylate) wherein $0<w_{STY} \leq 80\%$, polystyrene-block-poly(hexyl acrylate) wherein $0<w_s \leq 80\%$, poly(propyl methacrylate)-block-poly(ethyl acrylate) wherein $0<w_{PPMA}<100\%$, poly(butyl methacrylate)-block-poly(butyl acrylate) wherein $0<w_{PBMA}<100\%$, poly(propyl methacrylate)-block-poly(propyl acrylate) wherein $0<w_{PPMA}<100\%$, poly(propyl methacrylate)-block-poly(butyl acrylate) wherein $0<w_{PPMA}<100\%$, poly(ethyl methacrylate)-block-poly(propyl acrylate) wherein $0<w_{EMA} \leq 90\%$, poly(ethyl methacrylate)-block-poly(butyl acrylate) wherein $0<w_{EMA} \leq 90\%$, poly(cyclohexyl methacrylate)-block-poly(propyl acrylate) wherein $0<w_{CHMA} \leq 80\%$, poly(cyclohexyl methacrylate)-block-poly(butyl acrylate) wherein $0<w_{CHMA} \leq 85\%$, poly(propyl acrylate)-block-poly(butyl methacrylate) wherein $0<w_{PPA}<100\%$, and poly(propyl acrylate)-block-polycaprolactone wherein $0<w_{PPA}<100\%$.

In one embodiment, a poly(butyl acrylate) (PBA) block can be substituted with a random copolymer of two or more monomers. Examples of such monomers include MA, EA, PA, HA, OA and LA (MA=methyl acrylate; EA=ethyl acrylate; PA=propyl acrylate; HA=hexyl acrylate; OA=octyl acrylate; and LA=lauryl acrylate). The random copolymer can include any combination of two or more of these monomers, particularly those combinations that satisfy the criteria of eqns. (1 and 2), the third term of equation (3), and equation (12) where B is the random copolymer and A is the hard block. Examples of the hard block in this embodiment include PS, PEMA, PCHMA, PPMA or PBMA (PS=polystyrene; PEMA=poly(ethyl methacrylate); PCHMA=poly(cyclohexyl methacrylate); PPMA=poly(propyl methacrylate); PBMA=poly(butyl methacrylate)). It is understood that the combination of two or monomers involve different monomers (e.g. for a random copolymer, a first monomer is different from a second monomer). Examples of random copolymers comprising two monomers in this embodiment include LA/MA, HA/MA, OA/MA, LA/EA, HA/EA, OA/EA, LA/PA, HA/PA, and OA/PA. Examples of random copolymers comprising three monomers in this embodiment include LA/EA/MA, LA/HA/MA, LA/OA/MA, LA/PA/MA, LA/PA/MA, HA/OA/MA, HA/EA/MA, HA/PA/MA, LA/EA/PA, LA/EA/PA, OA/EA/PA, and HA/EA/PA.

The density of the random copolymer block, $\rho_{ran}$ at 25° C. can be calculated according to equation (13):

$$1/\rho_{ran} = w_1/\rho_1 + w_2/\rho_2 + w_3/\rho_3 + \tag{13}$$

where $w_i$ is a weight fraction of the monomer i in the copolymer and $\rho_i$ is the density of the homopolymer of i at 25° C.

In one embodiment, a PEA (poly(ethyl acrylate)) block can be substituted with a random copolymer of two or more monomers. Examples of random copolymer components include MA/PA, LA/MA, HA/MA, OA/MA, BA/MA, or any combination of the monomers MA, BA, PA, HA, OA and LA, particularly those combinations that satisfy the criteria of eqns. (1 and 2), the third term of equation (3), and equation (12) where B is the random copolymer and A is the hard block. Examples of the hard block in this embodiment include PCL (polycaprolactone), PEMA, PPMA.

In one embodiment, a PPA (poly(propyl acrylate) block can be substituted with a random copolymer of two or more monomers. Examples of random copolymer components include EA/BA, EA/HA, EA/LA, EA/OA, LA/MA, HA/MA, OA/MA, BA/MA, or any combination of the monomers MA, BA, EA, HA, OA and LA, particularly those combinations that satisfy the criteria of eqns. (1 and 2), the third term of equation (3), and equation (12) where B is the random copolymer and A is the hard block. Examples of the hard block in this embodiment include PCL, PEMA, PCHMA, PPMA, PBMA.

In one embodiment, a PBMA block (BMA=butyl methacrylate) can be substituted by any of the random copolymers having two or more of the monomers such as MMA, EMA, PMA, HMA, OMA and LMA; MMA=methyl methacrylate; EMA=ethyl methacrylate; PMA=propyl methacrylate; HMA=hexyl methacrylate; OMA=octyl methacrylate; and LMA=lauryl methacrylate. Examples of such random copolymers include, LMA/MMA, HMA/MMA, OMA/MMA, LMA/EMA, HMA/EMA, OMA/EMA, LMA/PMA, HMA/PMA, OMA/PMA, LMA/EMA/MMA, LMA/HMA/MMA, LMA/OMA-/MA, LMA/PMA/MMA, LMA/PMA/MMA, HMA/OMA/MMA, HMA/EMA/MMA, HMA/PMA/MMA, LMA/EMA/PMA, LMA/EMA/PMA, OMA/EMA/PMA, HMA/EMA/PMA, or any combinations of MMA, EMA, PMA, HMA, OMA and LMA, particularly those combinations that satisfy the criteria of eqns. (1) and (2), the third term of equation (3), and equation (12) where B is the random copolymer and A is the soft block. Examples of the soft block are PBA and PPA.

In one embodiment, a PEMA block can be substituted by any of the random copolymers of LMA/MMA, HMA/MMA, OMA/MMA, BMA/MMA, MMA/PMA, or any combinations of two or more of the monomers MMA, PMA, BMA, HMA, OMA and LMA, particularly those combinations that satisfy the criteria of eqns. (1) and (2), the third term of equation (3), and equation (12) where B is the random copolymer and A is the soft block. Examples of the soft block in this embodiment include PEA, PCL, PPA, PBA.

In one embodiment, a PPMA block can be substituted by any of the random copolymers of EMA/BMA, EMA/HMA, EMA/LMA, EMA/OMA, LMA/MMA, HMA/MMA, OMA/MMA, BMA/MMA, or any combinations of two or more of the monomers MMA, BMA, EMA, HMA, OMA and LMA, particularly those combinations that satisfy the criteria of eqns. (1) and (2), the third term of equation (3), and equation (12) where B is the random copolymer and A is the soft block. Examples of the soft block in this embodiment include PEA, PPA, PBA.

In one embodiment, a PS block can be substituted by a random copolymer comprising any of the following combinations: BMA/CHMA, S/BMA, S/CHMA, S/BMA/CHMA, particularly those combinations that satisfy the criteria of eqns. (1) and (2), the third term of equation (3), and equation (12) where B is the random copolymer and A is the soft block. Examples of the soft block in this embodiment include PVEE (polyvinyl ethylether), PHMA, PBA, PHA.

The block copolymers described herein can be synthesized using any known methods for this purpose, including living anionic polymerization methods (e.g. see R. P. Quirk and M. Morton in Thermoplastic Elastomers, Hansen, Munich, Germany, pp. 74–78, 1996) so-called living free radical polymerization methods such as atom transfer radical polymerization (ATRP) (see, for example, T. E. Patten et al., Adv. Mater. Vol. 10, p. 901, 1998) or stable free radical polymerization (SFRP) using TEMPO (see, for example, N. A. Listigovers et al. Macromolecules Vol. 29, p. 8992, 1996).

Those of ordinary skill in the art can determine $w_h$ ether a block copolymeric product has been processed according to the technique of the invention, i.e. via Newtonian flow at less than 150° C. or other preferred temperatures, by comparing the product to a first product made from identical starting materials according to the techniques of the invention and a second product made from identical starting materials according to conventional, higher temperature techniques. Product made according to techniques of the invention will differ from those made from conventional, higher temperature techniques in one or more of molecular weight, rheological properties, structural chemical degradation (which can be determined by elemental analysis, NMR, and/or weight change, etc.), and these determinations can be made by those of ordinary skill in the art using well-known analytical methods.

The function and advantage of these and other embodiments of the present invention will be more fully understood from the examples below. The following examples are intended to illustrate the benefits of the present invention, but do not exemplify the full scope of the invention.

EXAMPLE 1

Table 1 serves to illustrate the use of two criteria in evaluating polymer compositions that should exhibit large pressure coefficients and are potentially suitable as baroplastic elastomers.

TABLE 1

Application of thermodynamic criterion to polymer pairs.

| System | $3^{rd}$ term + for T > 100° C. (eq. 1) | $1.06\rho_A < \rho_B < 0.94\rho_A$ (eq. 10) |
|---|---|---|
| PS/PBMA | Yes | Yes |
| PS/PCHMA | No | Yes |
| PS/PHMA | Yes | Yes |
| PS/PαMS | No | Yes |
| PS/PI | Yes | No |
| PS/PB | Yes | No |
| PEMA/PEA | Yes | Yes |
| PMMA/PMA | No | Yes |
| PMMA/PEO | No | No |
| PB/PI | No | Yes |
| PS/PVME | No | Yes |
| PEA/PCHMA | No | Yes |
| PMMA/PEA | Yes | Yes |
| PEMA/PMA | Yes | Yes |
| PBMA/PEA | Yes | No |
| PCL/PMMA | Yes | No |
| PCL/PEMA | Yes | Yes |
| PCL/PEA | Yes | Yes |

Table 1 uses the following abbreviations: PS for polystyrene, PBMA for poly(n butyl methacrylate), PHMA for poly(n hexyl methacrylate), PEMA for poly(ethyl methacrylate), PMMA for poly(methyl methacrylate), PEO for polyethylene oxide, PB for polybutadiene, PI for polyisoprene, PBA for poly(n butyl acrylate), PEA for poly(ethyl methacrylate), PαMS for poly(α methyl styrene), PCHMA for poly(cyclohexyl methacrylate), PVME for poly(vinyl methyl ether) and PCL for poly(caprolactone).

Table 1 shows that of the systems listed, PS/PBMA, PS/PHMA, PEMA/PEA, PMMA/PEA, PEMA/PMA, PCL/PEMA and PCL/PEA all meet the required thermodynamic criteria for a baroplastic elastomer, namely the third term of eq. (3) is positive for temperatures above 100° C., and eq. (12) holds. The systems PS/PαMS, PMMA/PMA, PS/PCHMA, PS/PVME, PCHMA/PEA and PB/PI, with their $3^{rd}$ term of eq. (3) remaining negative even at temperatures above 100° C., are too miscible to exhibit the ordered state or the order-disorder transition in a temperature range suitable for a baroplastic elastomer. By contrast, the systems PS/PI, PS/PB, PCL/PMMA, and PEA/PBMA exhibit too large an energetic or packing mismatch, manifest in their disparate densities, to mix together for any commercially interesting molecular weights. The system PMMA/PEO fails both thermodynamic criteria.

EXAMPLE 2

General

The following four candidate baroplastic elastomers have been synthesized: polystyrene-block-poly hexyl methacrylate (PS-b-PHMA), polystyrene-block-poly butyl acrylate (PS-b-PBA), polystyrene-block-poly(methyl acrylate-random-lauryl acrylate) (PS-b-P(MA-r-LA)) and poly butyl methacrylate-block-poly butyl acrylate (PBMA-b-PBA). The pressure coefficients of their order/disorder (solid/liquid) transition has been determined by in situ small angle neutron scattering (SANS) measurements under hydrostatic pressure.

EXAMPLE 3

PS-b-PHMA

A model block copolymer of PS and PHMA was synthesized by classical anionic polymerization in tetrahydrofuran (THF) using sec-butyl lithium as the initiator, as described in (A.-V. G. Ruzette et al., Macromolecules 31, 1998, 8509). The total molecular weight was 34,000 g/mol and the composition 50 wt % PS. The phase behavior of this block copolymer was determined using in situ small angle neutron scattering (SANS) measurement under hydrostatic pressure.

At atmospheric pressure, this block copolymer exhibits a DOT (disorder-order transition) at 162° C. [A.-V. G. Ruzette et al., Macromolecules 31, 1998, 8509]. Hence, below this temperature, it is in the microphase separated (solid-like) state, $w_h$ ile at temperatures exceeding 162° C., it is in the segmentally-mixed liquid sate. Upon the application 1 kbar of pressure, the solid/liquid transition of this block copolymer is lowered by 60° C. FIG. 1 shows the circularly averaged scattering intensity profile at 140° C. and indicated pressures. At this temperature and at atmospheric pressure, a sharp scattering maximum is observed at a wave vector q~0.03 Å$^{-1}$, indicative of the microphase separated state. [see, for example, T. Hashimoto in Thermoplastic Elastomers, Hansen, Munich, Germany, 1996, pp. 429–463] Upon the application of 0.33 kbar (5000 psi), the block copolymer undergoes a solid/liquid transition, as evidenced by the distinct decrease in peak intensity and increase in peak width. At pressures of 0.33 kbar and above, the block copolymer is in the disordered (liquid) state, as evidenced by the broad scattering maximum observed at those pressures. From similar data obtained at a series of pressures and temperatures, a pressure coefficient of $dT_{DOT}/dP=60°$ C./kbar is extracted. Since these pressure coefficients do not depend on molecular weight or composition (M. Pollard et al., Macromolecules 31, 1998, pg. 6493), similar pressure effects are expected for PS-b-PHMA containing 10 or 20 wt % PS compositions at wich this block copolymer will have elastomeric properties. These materials would exhibit $T_{g,mix}$ values of 7.5° C. and 16° C., respectively.

EXAMPLE 4

PS-b-PBA and PS-b-P(MA-r-LA)

Block copolymers of styrene and butyl acrylate, PS-b-PBA, as well as various random copolymers of methyl and lauryl acrylate (PS-b-P(MA-r-LA)) were synthesized by atom transfer radical polymerization [see, for example, T. E. Patten et aL, Adv. Mater. 10, 1998, 901] in two steps. The monomers, purchased from Aldrich, were used as received. The acrylate block was prepared first, in bulk, using methyl-2-chloropropionate (Aldrich, used as received) as the initiator and Copper$^{(I)}$Cl/1, 1, 4, 4, 10, 10-hexamethyltriethylenetetramine (both from Aldrich, used as received) as the transition metal/ligand catalyst complex. BA, or MA and LA (40≦vol % MA≦60), were combined with 0.06 g Cu$^{(I)}$Cl and 0.5 ml amine (Cu$^{(I)}$Cl:amine=1:3) in a conical flask which was then sealed with a rubber septum secured by copper wire. The monomer/catalyst mixture was degassed by refluxing dry, grade 5.0 nitrogen for 15 min. Towards the end of those 15 min., the initiator (70 μl, initiator:Cu$^{(I)}$Cl=1:1) was injected under a continuous flow of nitrogen and the reaction vessel was then placed in an oil bath equilibrated at a temperature of 90° C. Polymerization was carried out at 90° C. for 12 hrs, after which the reaction mixture was precipitated in methanol and allowed to decant for 1 hour. The resulting PBA homopolymer, or P(MA-r-LA) random copolymer, was re-dissolved in THF and precipitated in methanol 3 times to remove unreacted monomer and the catalyst complex. The purified acrylate first block was then dried overnight at room temperature under vacuum. The P(MA-r-LA) random copolymer compositions, as determined by $^1$H nuclear magnetic resonance ($^1$H NMR) were found to correspond precisely to the feed volume fractions. The dried and purified acrylate first block was then used as a macroinitiator for the ATRP of styrene (Aldrich, used as received) in N,N-dimethylformamide (DMF, Aldrich, used as received) at 130° C. [conditions after M. Cassebras et al. Macroml. Rapic. Commun. 20, 1999, 261]. PBA (2 g), or P(MA-r-LA) (2 g), was dissolved in 20 ml of DMF in a schlenk tube equipped with a stir bar. Cu$^{(I)}$Cl (0.01 g), the amine ligand (82 μl, Cu$^{(I)}$Cl:ligand=3:1), and styrene monomer (4 ml) were added to the solution, which was then degassed for 15 min. and subsequently placed in an oil bath equilibrated at a temperature of 130° C. Polymerization of the PS second block was allowed to proceed for 48 hrs, after which the reaction mixture was precipitated in methanol. The filtered block copolymer was then purified 3 times by dissolution/precipitation in THF/methanol and dried overnight under vacuum at 40° C. Compositions of the block copolymers were determined using $^1$H nuclear magnetic resonance (NMR). Molecular weights were measured by gel permeation chromatography (GPC) in THF using PS standards.

Figure 2:
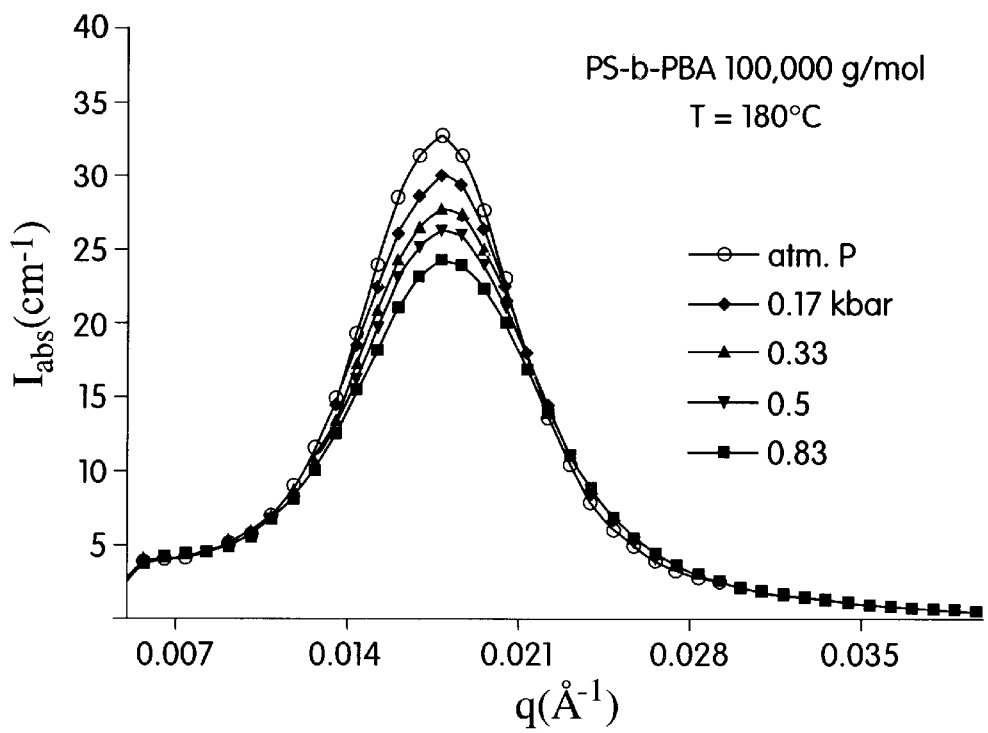
FIG. 2 shows a scattering intensity profile for 100 K PS-b-PBA at 180° C. and indicated pressures.

FIG. 2 shows the scattering intensity profile at 180° C. and indicated pressures for PS-b-PBA containing 70 wt % PS and having a molecular weight of 100,000 g/mol with respect to PS standards. For this system $T_{g,mix}$=35° C. At atmospheric pressure, this block copolymer undergoes a $T_{DOT}$ at ~160° C. Even though this block copolymer is in the disordered state at 180° C., a strong decrease in scattering intensity is observed upon the application of pressure, indicating that pressure favors the segmentally mixed liquid in this material.

From the data shown in FIG. 2 and similar data at other temperatures and pressures, one can extract a pressure coefficient for the disorder-order transition temperature of this block copolymer, $dT_{DOT}/dP$, of 100° C./kbar. A similar pressure coefficient of 90° C./kbar is also obtained for PS-b-P(MA-r-LA) containing 52 wt % MA in the acrylate block and 54 wt % PS. This copolymer has an estimated value of $T_{g,mix}$=9° C.

EXAMPLE 5

PBMA-b-PBA

A fourth candidate baroplastic elastomer of poly butyl methacrylate and poly butyl acrylate (PBMA-b-PBA) was synthesized by ATRP in two steps. The PBA block was synthesized first, as described in Example 4. The purified PBA (2 g) was then dissolved in 5 mL of DMF. Cu$^{(I)}$Cl (0.01 g), the amine ligand (82 μl, Cu$^{(I)}$Cl:ligand=3:1), and butyl methacrylate (Aldrich, used as received, 4 ml) were added to the solution, which was then degassed for 15 min. and subsequently placed in an oil bath equilibrated at a temperature of 120° C. Polymerization of the PBMA second block was allowed to proceed for 20 hrs, after which the reaction mixture was precipitated in methanol. The filtered block copolymer was then purified 3 times by dissolution/precipitation in THF/methanol and dried overnight under vacuum at 40° C. Although the pressure coefficient of this block copolymer has not been measured at this time, PBMA-b-PBA displays excellent mechanical properties at room temperature, and can be molded at 60° C. under the application of a pressure of 500 psi. This copolymer has an estimated value of $T_{g,mix}$=−14° C.

EXAMPLE 6

Prediction of Phase Diagrams

FIGS. 3–6 show phase diagrams for various polymer blends predicted by inputting known thermodynamic parameters into equation (3), as described herein. For example FIG. 3A, depicts a PS/PMMA blend (8 K: MW=8000 g/mol; 6 K: MW=6000 g/mol) exhibiting one phase (i.e., the miscible state, denoted as "1φ") at higher temperatures and two phases (i.e., the phase separated state, denoted as "2φ") at lower temperatures as a function of weight fraction of polystyrene. The curves denote the order-disorder (or disorder-order) transition.

Figure 3A:
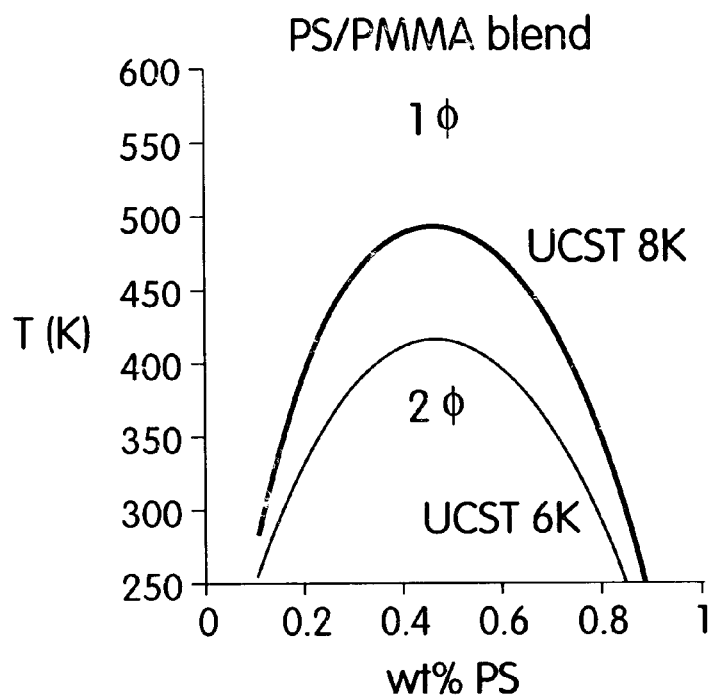
FIG. 3 shows predicted phase diagrams for styrene/methacrylate blends for (a) PS/PMMA blend, (b) PS/PEMA blend, (c) PS/PBMA blend, (d) PS/PCHMA blend, (e) PS/PnOMA blend, (f) PS/PnLMA blend.
Figure 3B:
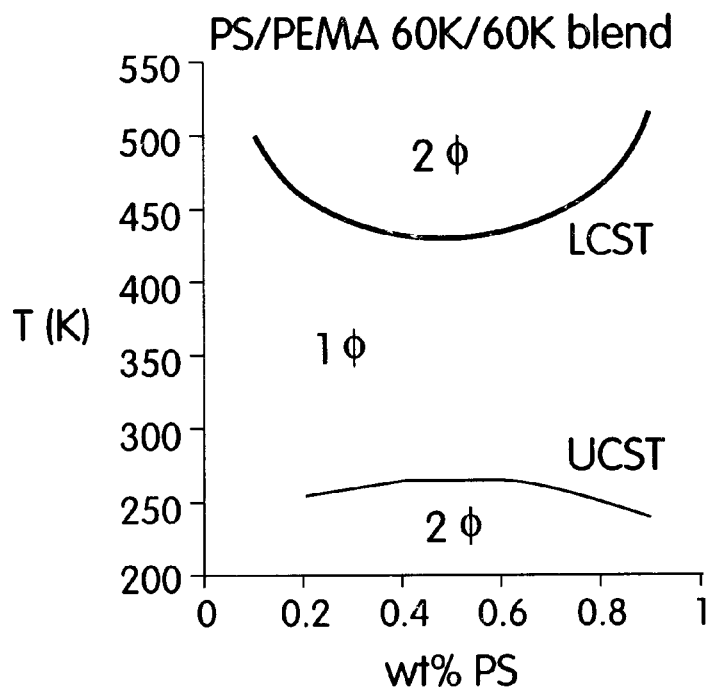
Figure 3C:
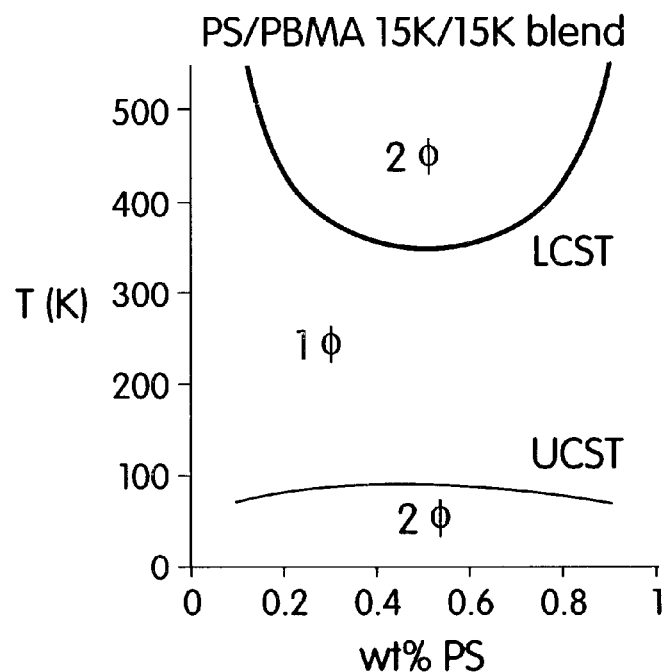
Figure 3D:
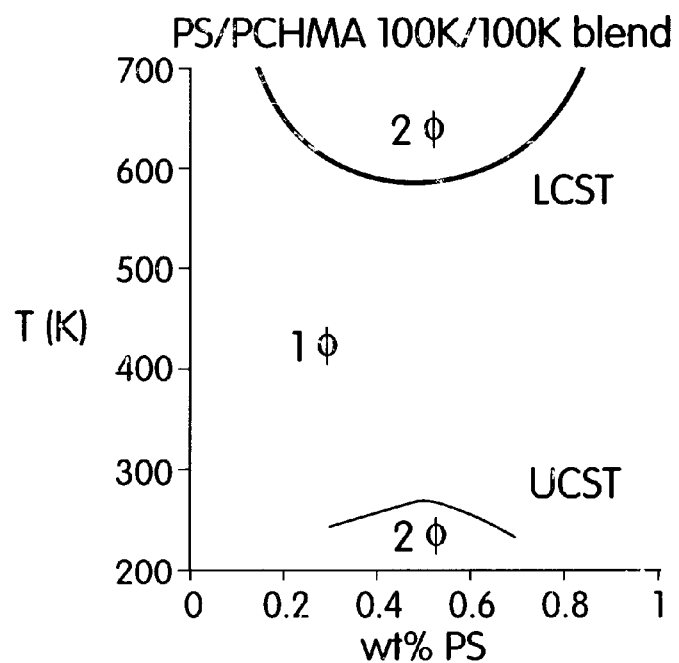
Figure 3E:
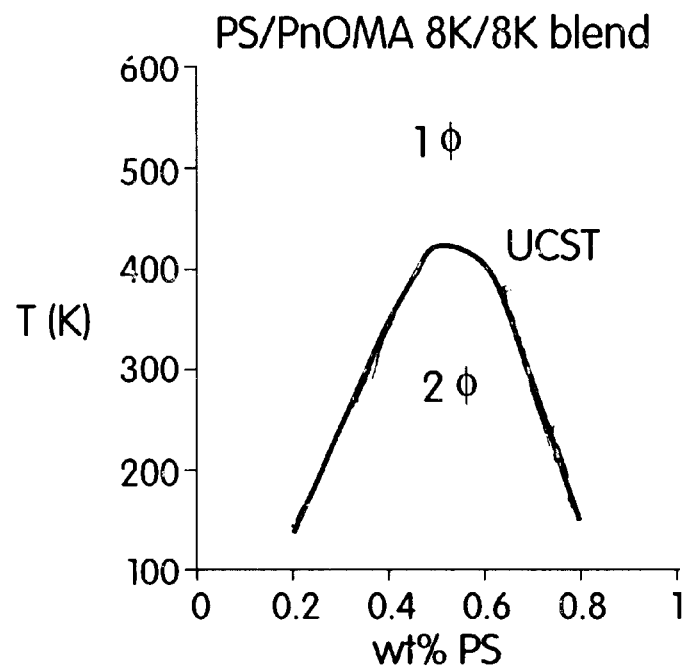
Figure 3F:
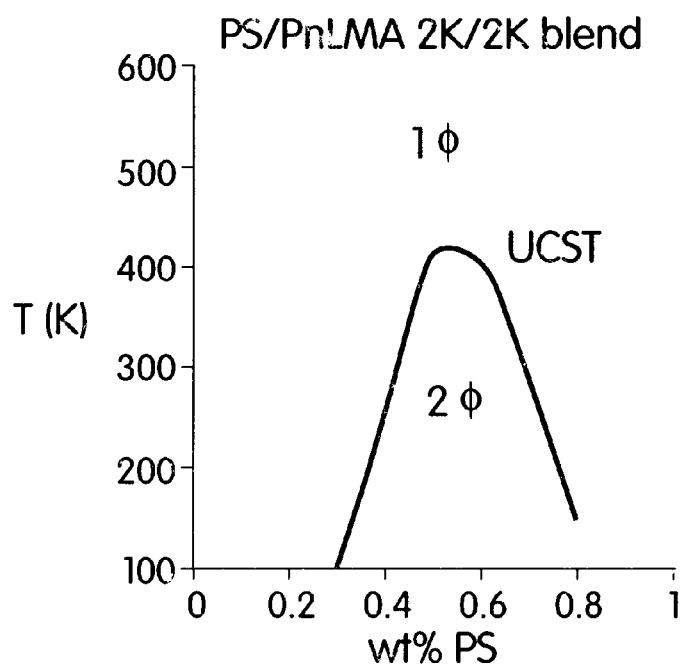
Figure 4A:
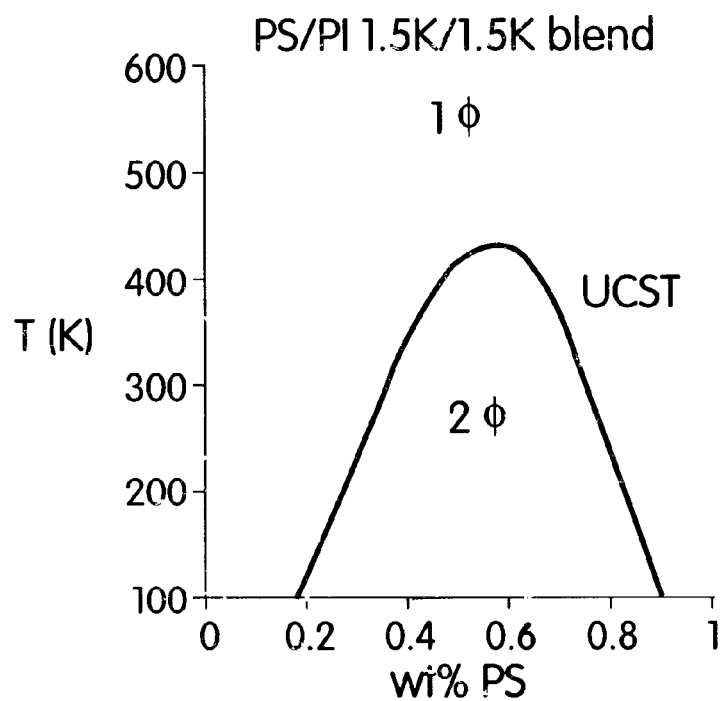
FIG. 4 shows predicted phase diagrams for (a) PS/PI, (b) PS/PB, (c) PB/PI, and (d) PIB/P(E-r-B) blends (where PS=polystyrene, PI=polyisoprene, PB=polybutadiene, PIB=polyisobutylene and P(E-r-B)66 refers to a random copolymer of ethylene and butene comprising 66 wt % of butene)
Figure 4B:
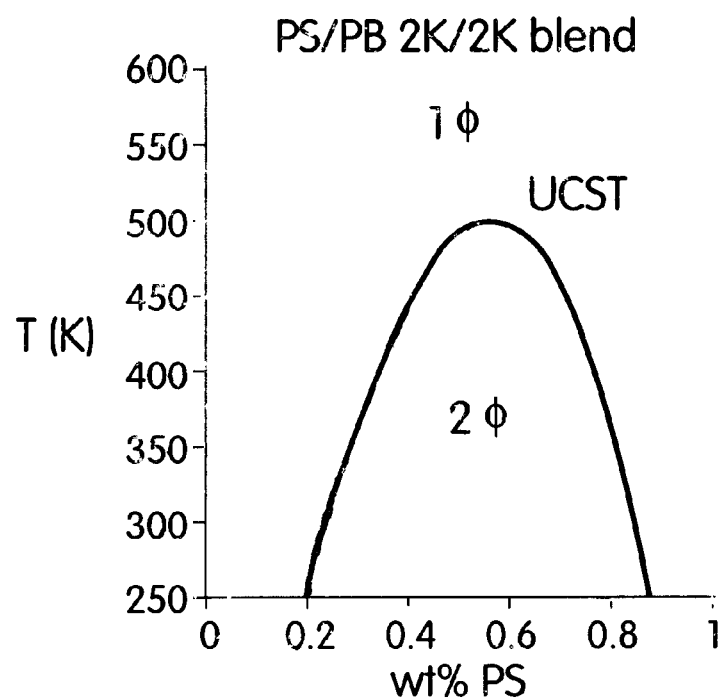
Figure 4C:
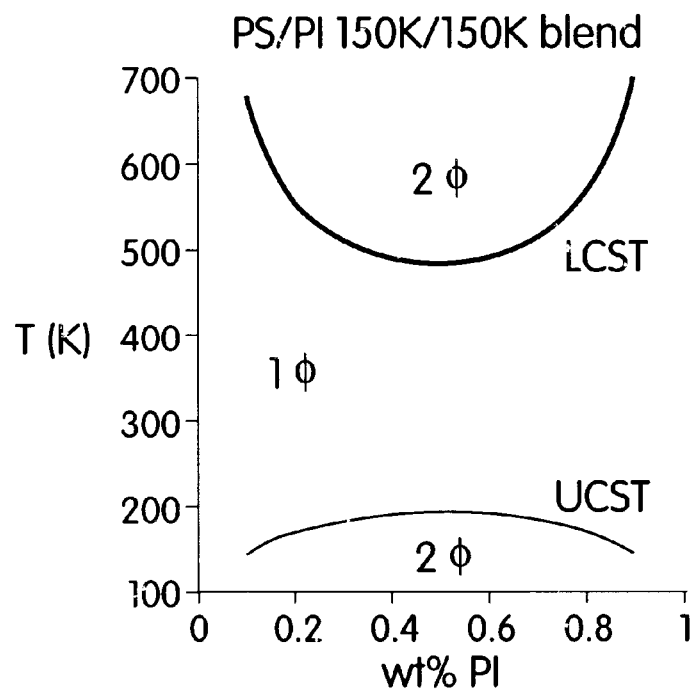
Figure 4D:
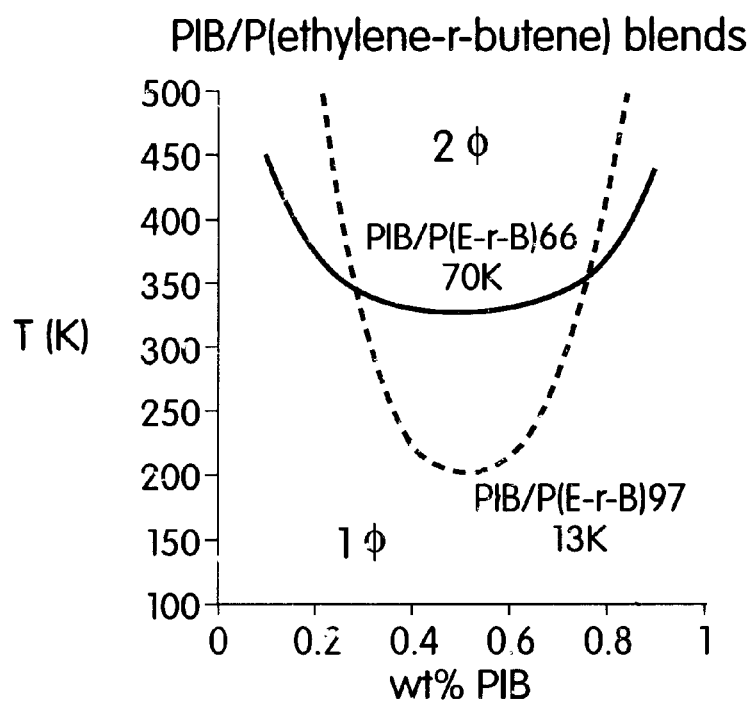
Figure 5A:
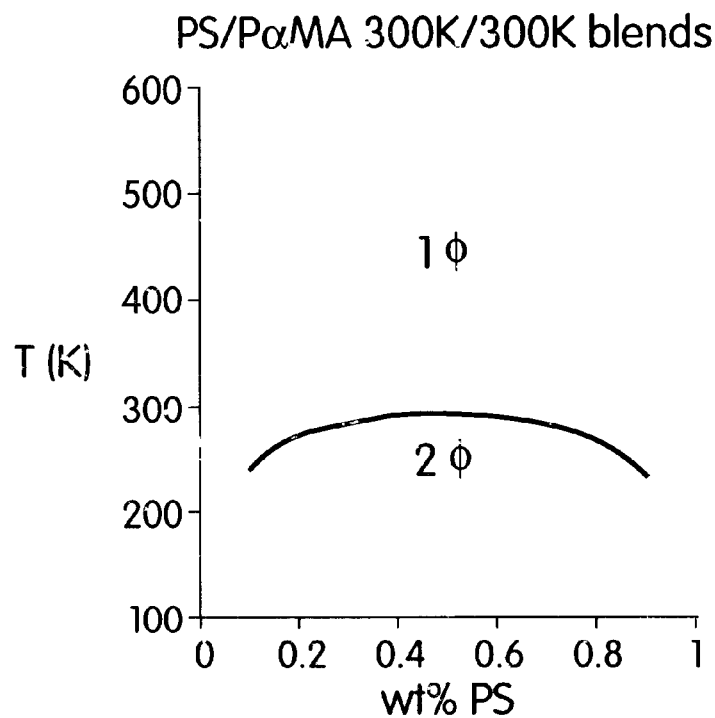
FIG. 5 shows predicted phase diagrams for (a) PS/PαMS and (b) PEA/PEMA blends, where PαMS=poly(alpha methyl styrene), PEA=poly(ethyl acrylate) and PEMA=poly(ethyl methacrylate)
Figure 5B:
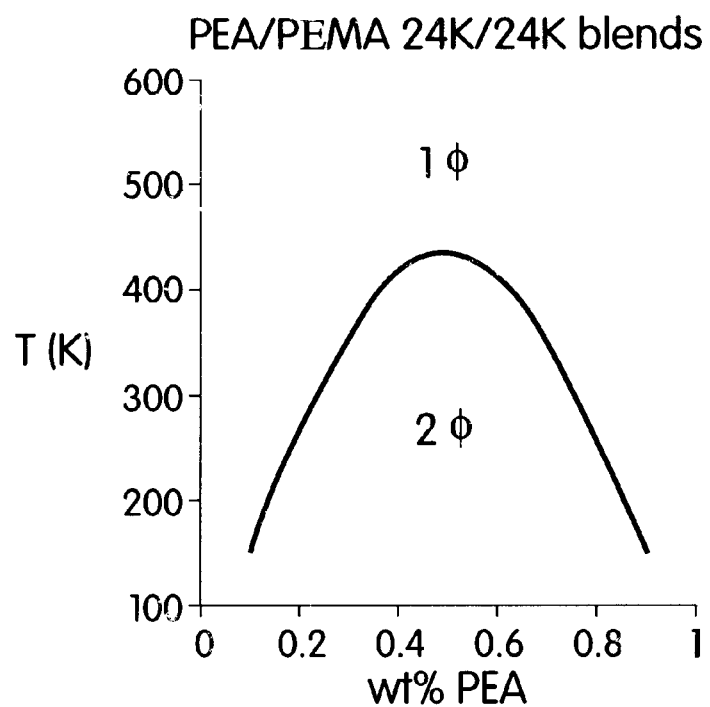
Figure 6A:
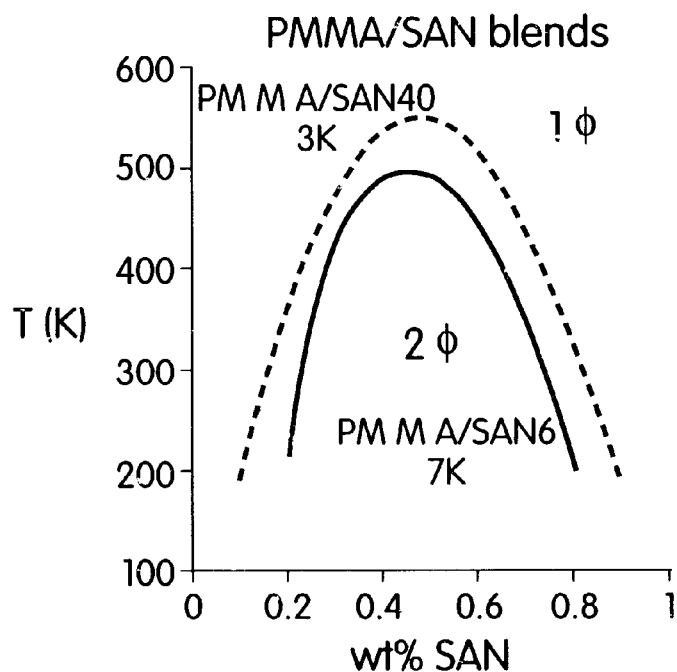
FIG. 6 shows predicted phase diagrams for (a) and (b) PMMA/SANXX, (c) and (d) PCL-SANXX and (e) and (f) PC/SANXX blends (where PMMA=poly(methyl methacrylate, PCL-polycaprolactone, PC=bisphenol A polycarbonate and SANXX refers to a random copolymer of styrene and acrylonitrile comprising XX wt % acrylonitrile)
Figure 6B:
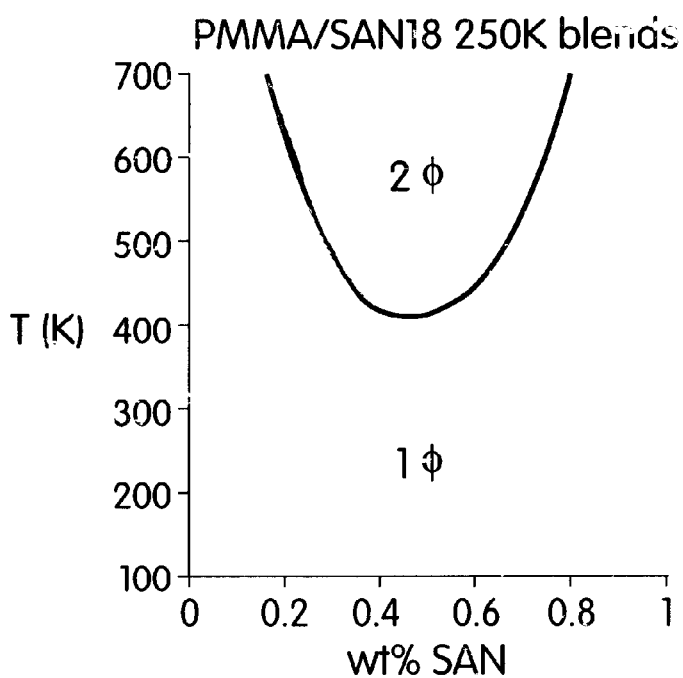
Figure 6C:
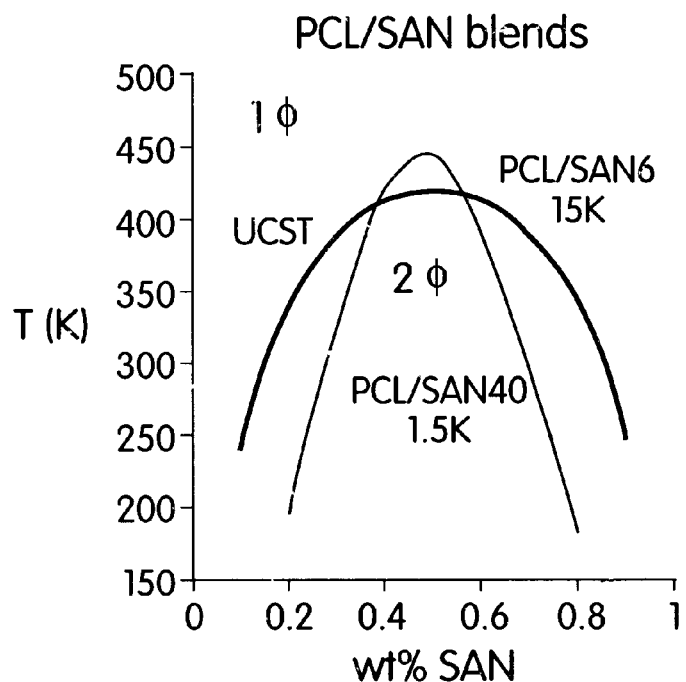
Figure 6D:
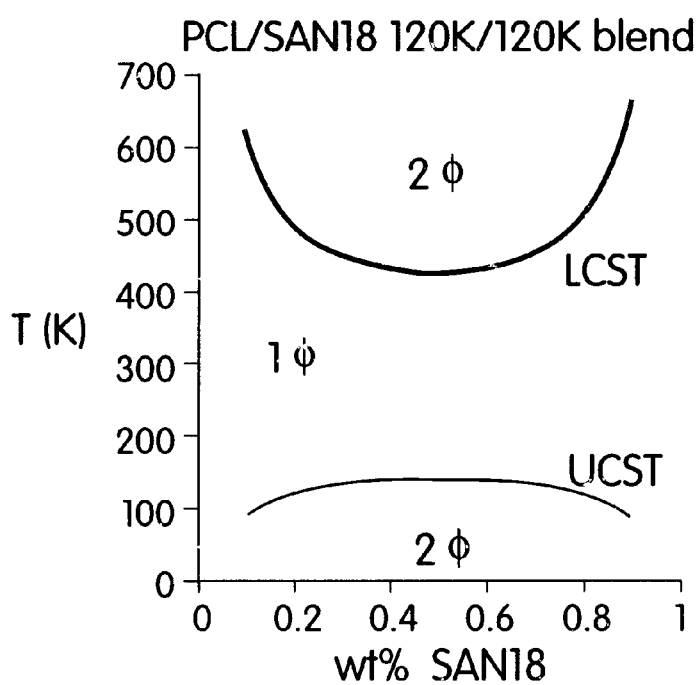
Figure 6E:
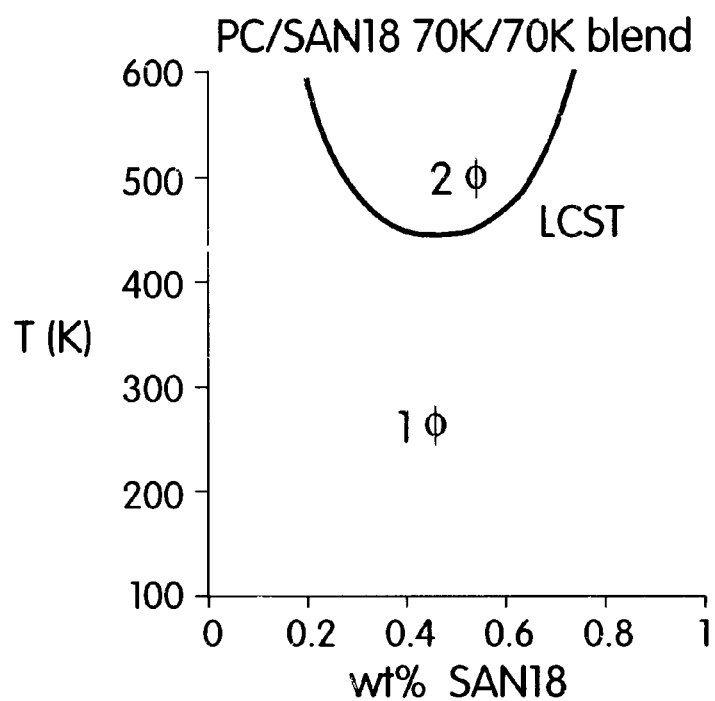
Figure 6F:
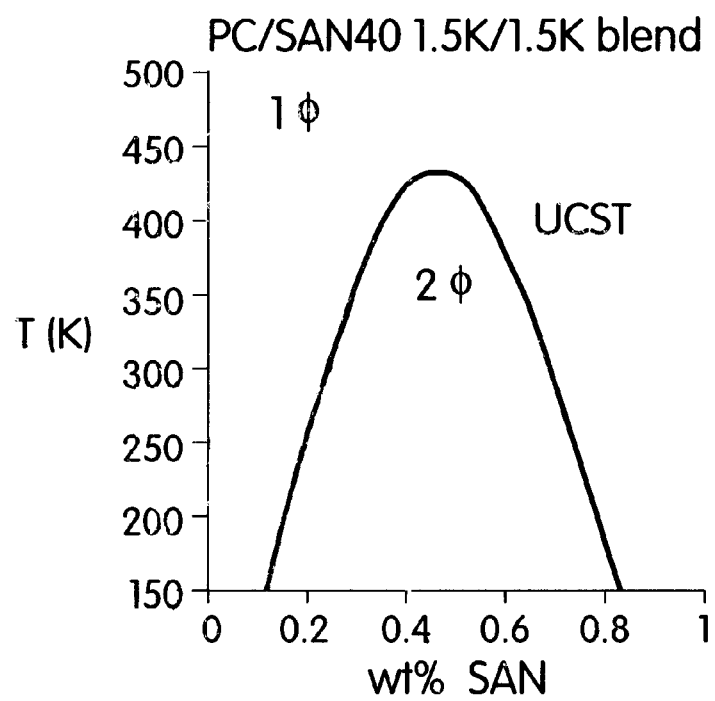
Figure 7A:
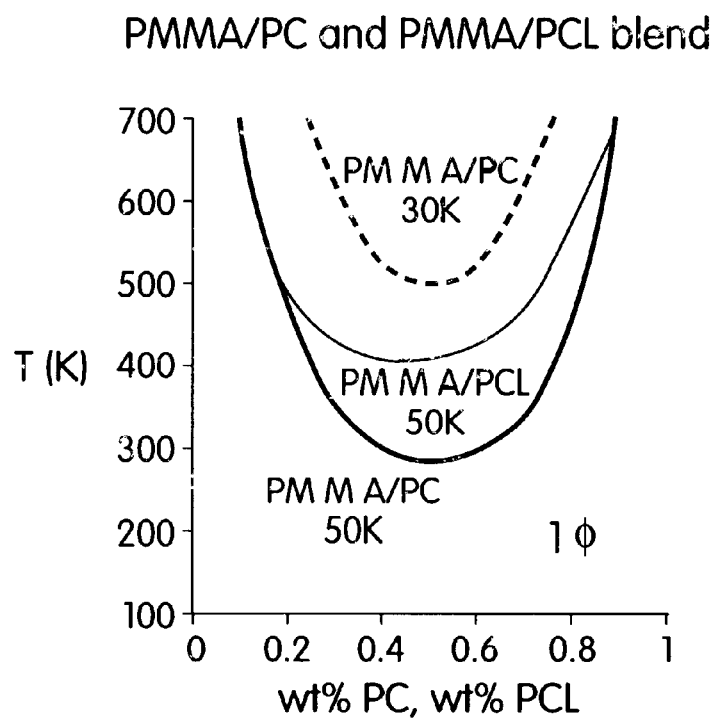
FIG. 7 shows predicted phase diagrams for (a) PMMA/PC, PMMA/PCL and (b) PMMA/PEO (PEO=polyethylene oxide).
Figure 7B:
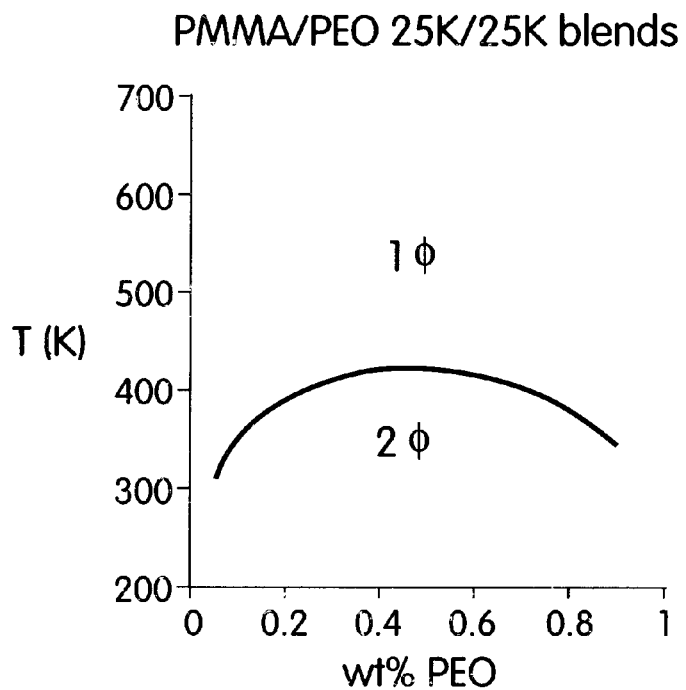

As another example, FIG. 3B shows a phase separated state at low temperatures, a miscible state at intermediate temperatures and a phase separated state at higher temperatures.

Those skilled in the art would readily appreciate that all parameters listed herein are meant to be examples and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method of processing a polymer, comprising:
   providing a block copolymeric composition comprising a soft component A having a $T_{g,s}$ of less than room temperature, a hard component B in contact with the soft component A, the hard component having a $T_{g,h}$ such that hard component has negligible flow at room temperature; and
   applying a pressure of at least about 100 psi such that the block copolymeric composition exhibits Newtonian flow at a processing temperature that is less than 150° C., wherein the composition does not exhibit Newtonian flow at the processing temperature in the absence of said pressure.

2. A method as in claim 1, wherein components A and B of the composition are selected to have a relation $\phi_A \phi_B [(\rho_A - \rho_B)(\delta_A^2 - \delta_B^2)]$ having a positive value at a temperature above 100° C., wherein $\phi_A$ and $\phi_B$ represent volume fractions of the components A and B respectively, $\rho_A$ and $\rho_B$ represent reduced densities of the components A and B respectively, and $\delta_A$ and $\delta_B$ represent solubility parameters of the components A and B respectively; and
   the densities $\rho_A$ and $\rho_B$ being matched as defined by the following relationship:

$1.06 \rho_A < \rho_B < 0.94 \rho_A$.

3. The method of claim 2, wherein $\phi_A \phi_B [(\rho_A - \rho_B)(\delta_A^2 - \delta_B^2)]$ has a positive value at a temperature above 50° C.

4. The method of claim 2, wherein $\phi_A \phi_B [(\rho_A - \rho_B)(\delta_A^2 - \delta_B^2)]$ has a positive value at a temperature above 0° C.

5. The method of claim 1, wherein a pressure coefficient, dT/dP, of the composition has an absolute value greater than about 30° C./kbar.

6. The method of claim 5, wherein the pressure coefficient has an absolute value greater than about 50° C./kbar.

7. The method of claim 5, wherein the pressure coefficient has an absolute value greater than about 100° C./kbar.

8. The method of claim 1, wherein upon the application of pressure of at least about 100 psi and at a temperature of no more than 150° C., the composition is in a miscible state and has a glass transition temperature $T_{g,mix}$, as defined by the relation:

$1/T_{g,mix} = w_s/T_{g,s} + w_h/T_{g,h}$ wherein $w_s$ and $w_h$ are weight fractions of the soft and hard components respectively.

9. The method of claim 8, wherein the block copolymeric composition is selected from the group consisting of polystyrene-b-poly(hexyl methacrylate) copolymers wherein $0 < w_s \leq 45\%$, poly(ethyl methacrylate)-b-poly(ethyl acrylate) copolymers wherein $0 < w_{EMA} \leq 85\%$, polycaprolactone-b-poly(ethyl acrylate) wherein $0 < w_{PCL} < 100\%$, polycaprolactone-block-poly(ethyl methacrylate) wherein $0 < w_{EMA} \leq 92\%$, poly(caprolactone)-block-poly(methyl methacrylate) wherein $0 < w_{MMA} \leq 75\%$, poly(methyl methacrylate)-b-poly(ethyl acrylate) copolymers wherein $0 < w_{MMA} \leq 65\%$, poly(ethyl methacrylate)-b-poly(methyl acrylate) copolymers wherein $0 < w_{EMA} \leq 85\%$, polystyrene-block-poly(vinyl ethyl ether) wherein $0 < w_{STY} \leq 80\%$, polystyrene-block-poly(butyl acrylate) wherein $0 < w_{STY} \leq 80\%$, polystyrene-block-poly(hexyl acrylate) wherein $0 < w_s \leq 80\%$, poly(propyl methacrylate)-block-poly(ethyl acrylate) wherein $0 < w_{PPMA} < 100\%$, poly(butyl methacrylate)-block-poly(butyl acrylate) wherein $0 < w_{PBMA} < 100\%$, poly(propyl methacrylate)-block-poly(propyl acrylate) wherein $0 < w_{PPMA} < 100\%$, poly(propyl methacrylate)-block-poly(butyl acrylate) wherein $0 < w_{PPMA} < 100\%$, poly(ethyl methacrylate)-block-poly(propyl acrylate) wherein $0 < w_{EMA} \leq 90\%$, poly(ethyl methacrylate)-block-poly(butyl acrylate) wherein $0 < w_{EMA} \leq 90\%$ poly(cyclohexyl methacrylate)-block-poly(propyl acrylate) wherein $0 < w_{CHMA} \leq 80\%$, poly(cyclohexyl methacrylate)-block-poly(butyl acrylate) wherein $0 < w_{CHMA} \leq 85\%$, poly(propyl acrylate)-block-poly(butyl methacrylate) wherein $0 < w_{PPA} < 100\%$, and poly(propyl acrylate)-block-polycaprolactone wherein $0 < w_{PPA} < 100\%$.

10. The method of claim 9, wherein poly(butyl acrylate) is substituted by a random copolymer of two or more monomers selected from MA, EA, PA, HA, OA, DA, and LA.

11. The method of claim 9, wherein poly(ethyl acrylate) is substituted by a random copolymer of two or more monomers selected from MA, PA, BA, HA, OA, DA, and LA.

12. The method of claim 9, wherein poly(propyl acrylate) is substituted by a random copolymer of two or more monomers selected from MA, EA, BA, HA, OA, DA, and LA.

13. The method of claim 9, wherein poly(butyl methacrylate) is substituted by a random copolymer of two or more monomers selected from MMA, EMA, PMA, HMA, OMA, DMA, and LMA.

14. The method of claim 9, wherein poly(ethyl methacrylate) is substituted by a random copolymer of two or more monomers selected from MMA, PMA, BMA, OMA, HMA, DMA, and LMA.

15. The method of claim 9, wherein poly(propyl methacrylate) is substituted by a random copolymer of two or more monomers selected from MMA, EMA, BMA, OMA, HMA, DMA, and LMA.

16. The method of claim 9, wherein polystyrene is substituted by a random copolymer comprising any of the following combinations: BMA/CHMA, S/BMA, S/CHMA, S/BMA/CHMA.

17. The method of claim 8, wherein the hard block has a $T_g$ of less than about 80° C.

18. The method of claim 8, wherein the hard block has a $T_g$ of less than about 50° C.

19. A pressure sensitive adhesive formed by the method of claim 1.

20. A pressure molded or injection molded article formed by the method of claim 1.

21. An elastomer formed by the method of claim 1.

22. A block copolymer comprising:

a soft block having a $T_{g,s}$ of less than room temperature;

a hard block bonded to the soft block, the hard block having a $T_{g,h}$ such that the hard block has negligible flow at room temperature; and wherein a pressure coefficient that favors miscibility, defined as a change in temperature of the disorder-order transition, $T_{DOT}$, of the block copolymer, as a function of change in pressure, $P(dT_{DOT}/dP)$, of the block copolymer has an absolute value greater than about 30° C./kbar.

23. The block copolymer of claim 22, wherein the pressure coefficient has an absolute value greater than about 50° C./kbar.

24. The block copolymer of claim 22, wherein the pressure coefficient has an absolute value greater than about 100° C./kbar.

25. The block copolymer of claim 22, wherein at a temperature of no more than 150° C. and under the application of pressure of at least 100 psi, the block copolymer is in a miscible state and has a glass transition temperature $T_{g,mix}$, as defined by the relation:

$$1/T_{g,mix} = w_s/T_{g,s} + w_h/T_{g,h}$$

wherein $w_s$ and $w_h$ are weight fractions of the soft and hard blocks respectively.

26. The block copolymer of claim 25, wherein the block copolymer is in a miscible state at a temperature of no more than 100° C. under the application of pressure of at least 100 psi.

27. The block copolymer of claim 25, wherein the block copolymer is in a miscible state at a temperature of no more than 60° C. under the application of pressure of at least 100 psi.

28. A method as in claim 1, comprising applying a pressure of at least about 200 psi such that the block copolymeric composition exhibits Newtonian flow at a processing temperature that is less than 150° C., wherein the composition does not exhibit Newtonian flow at the processing temperature in the absence of said pressure.

29. A method as in claim 28, wherein the pressure is at least about 500 psi.

30. A method as in claim 28, wherein the pressure is at least about 1000 psi.

31. A block copolymer as in claim 22, wherein, upon applying a pressure of at least about 200 psi, the block polymer exhibits Newtonian flow at a processing temperature that is less than 150° C., and the block copolymer does not exhibit Newtonian flow at the processing temperature in the absence of said pressure.

32. A block copolymer as in claim 31, wherein the pressure is at least about 500 psi.

33. A block copolymer as in claim 31, wherein the pressure is at least about 1000 psi.

\* \* \* \* \*